United States Patent

Johannsmeier et al.

[15] 3,683,195

[45] Aug. 8, 1972

[54] APPARATUS FOR THE AUTOMATIC ALIGNMENT OF TWO SUPERIMPOSED OBJECTS, E.G. A SEMICONDUCTOR WAFER AND MASK

[72] Inventors: Karl-Heinz Johannsmeier, Mountain View; Paul E. Stoft, Menlo Park; Tor G. Larsen, Cupertino, all of Calif.

[73] Assignee: Kasper Instruments Inc., Mt. View, Calif.

[22] Filed: March 22, 1971

[21] Appl. No.: 126,597

[52] U.S. Cl.........250/219 DR, 250/209, 235/61.11 E

[51] Int. Cl. ..............................................G08c 9/06

[58] Field of Search.......250/219 DR, 221, 222, 237, 250/208, 209; 356/172; 235/61.11 E, 61.6 A, 61.6 B; 95/44 C

[56] References Cited

UNITED STATES PATENTS

| | | | |
|---|---|---|---|
| 3,437,816 | 4/1969 | Mushinsky | 250/237 X |
| 3,497,705 | 2/1970 | Adler | 250/219 DR X |
| 3,560,097 | 2/1971 | Gavrilkin et al. | 250/237 X |
| 3,569,718 | 3/1971 | Borner | 250/219 DR X |
| 3,569,720 | 3/1971 | Fredriksen | 250/219 DR |

*Primary Examiner*—Walter Stolwein
*Attorney*—Roland Griffin

[57] ABSTRACT

An apparatus for automatically aligning a semiconductor wafer with a mask in the manufacture of integrated circuit devices is disclosed. The mask and wafer are each provided with alignment patterns, the wafer pattern cooperating with the mask pattern in unique visual manner to signify alignment. A scanning means is provided for automatically scanning the pattern areas and producing output signals indicative of the relative position of the wafer and mask patterns. Logic circuitry is provided for operating in response to said scan output signals to compute formulas responsive to any misalignment, said formulas being utilized to produce control signals for driving motor means to produce relative movement between the mask and wafer to bring them into alignment. Several separate alignment cycles are provided, if needed, for zeroing in on finalized alignment. A tolerance selection means is provided for permitting a variation in final alignment tolerance.

16 Claims, 17 Drawing Figures

INVENTORS
KARL-HEINZ JOHANNSMEIER
PAUL E. STOFT
TOR G. LARSEN
BY Roland I. Griffin
ATTORNEY INVENTORS
KARL-HEINZ JOHANNSMEIER
PAUL E. STOFT
TOR G. LARSEN
BY Roland D. Griffin
ATTORNEY INVENTORS
KARL-HEINZ JOHANNSMEIER
PAUL E. STOFT
TOR G. LARSEN
BY Roland D. Griffin
ATTORNEY INVENTORS
KARL-HEINZ JOHANNSMEIER
PAUL E. STOFT
TOR G. LARSEN
BY Roland I. Griffin
ATTORNEY INVENTORS
KARL-HEINZ JOHANNSMEIER
PAUL E. STOFT
TOR G. LARSEN
BY Roland I. Griffin
ATTORNEY INVENTORS
KARL-HEINZ JOHANNSMEIER
PAUL E. STOFT
TOR G. LARSEN
BY Roland I. Griffin
ATTORNEY

PATENTED AUG 8 1972 3,683,195

SHEET 07 OF 10

INVENTORS
KARL-HEINZ JOHANNSMEIER
PAUL E. STOFT
TOR E. LARSEN
BY Roland D. Griffin
ATTORNEY INVENTORS
KARL-HEINZ JOHANNSMEIER
PAUL E. STOFT
TOR G. LARSEN
BY Roland J. Griffin
ATTORNEY INVENTORS
KARL-HEINZ JOHANNSMEIER
PAUL E. STOFT
TOR G. LARSEN
BY Roland D. Griffin
ATTORNEY INVENTORS
KARL-HEINZ JOHANNSMEIER
PAUL E. STOFT
TOR G. LARSEN
BY Roland D. Griffin
ATTORNEY

APPARATUS FOR THE AUTOMATIC ALIGNMENT OF TWO SUPERIMPOSED OBJECTS, E.G. A SEMICONDUCTOR WAFER AND MASK

BACKGROUND OF THE INVENTION

In the present day manufacture of integrated circuits, complex circuit patterns are formed on the silicon wafers by photoresist techniques employing a series of contact printings on the wafer made from several prints or masks used in succession and in a preselected order. Each successive mask must be accurately aligned with the previous print or prints formed by the prior masks on the wafer so that the completed pattern is accurate within a few microns.

The alignment of each mask with the wafer substitute may be accomplished manually by manipulation of the mask over the wafer while the operator observes the mask and wafer through a high power microscope. The alignment may be aided by the use of a pair of spaced-apart patterns formed on each of the substrate and transparent mask, for example crosses or bullseyes, the two aligning patterns on the mask being arranged so that they are superimposed on and aligned with the two alignment patterns on the wafer when the wafer and mask are properly aligned.

Apparatus has been proposed for producing alignment of the mask and wafer by mechanically operated means, thus relieving the operator of this tedious task. One form of such automatic apparatus is described in U.S. Pat. No. 3,497,705 issued Feb. 24, 1970 to A. J. Adler entitled "Mask Alignment System Using Radial Patterns And Flying Spot Scanning." In this system a pair of spaced-apart radial patterns on the wafer are adopted to align with a pair of spaced-apart radial patterns on the transparent mask. The radials of the patterns on the mask are angularly displaced relative to the radials of the patterns on the wafer. A scanning system employing two flying spot scanners scans each of the two pairs of superimposed patterns in a circular manner about the center point of the pattern, measuring the angular distance between the successive radials encountered by the beam. Error signals derived from misalignment of the mask pattern radials with the wafer pattern radials are utilized to produce relative movement in X, Y, and rotational directions to bring the two pairs of patterns into proper alignment.

BRIEF SUMMARY OF THE PRESENT INVENTION

The present invention relates to an improved method and apparatus for the automatic alignment of two superimposed objects, for example a wafer and mask employed in integrated circuit manufacture. Both the wafer and mask are provided with a pair of spaced-apart patterns, each alignment pattern on the wafer comprising a plurality of opaque marks oriented in different directions relative to each other. Each alignment pattern on the mask comprises a plurality of opaque marks which, when the pattern on the mask is properly aligned with the pattern on the wafer, have certain marks oriented in the same directions as associated marks on the wafer, but linearly spaced a predetermined distance therefrom.

To produce automatic alignment of the wafer and mask after a course alignment has been made, a scanning system is employed to first scan the alignment patterns so as to examine the marks of the wafer and mask patterns extending in one orientation and to examine the marks thereof extending in another orientation, information designating the positions, i.e., the direction off center alignment, of the marks of the two mask patterns relative to the marks of the two associated wafer patterns being produced and recorded. The alignment patterns are then again scanned so as to examine the marks of the wafer and mask patterns extending in said one direction and to examine the marks extending in said other direction, and information designating the distance off center alignment between the marks of the two mask patterns relative to the marks of the two associated wafer patterns is produced therefrom. Control signals are computed from said position or direction information and said distance information, and these control signals serve to drive movable support mechanism for moving the wafer relative to the mask to bring the two into alignment. The apparatus may be programmed to perform additional scans as required to produce optimum alignment.

In one embodiment of the invention, the marks are elongated bars, and the bars of said one orientation are directed at a substantial angle, for example 90°, relative to the bars of said other orientation. When aligned, the bars on the mask are positioned a predetermined linear distance from the associated bars on the wafer. The scanning system includes an opaque drum having a plurality of slots therein, one slot being oriented in the same direction as the marks of one orientation and another slot being oriented in the same direction as the marks of said other orientation. As the slots in the drum scan over the bars of the wafer and mask alignment patterns, light passing through the slot is interrupted by the opaque bars and produces a plurality of spaced-apart pulses. The time between pulses serves as an indication of the relative positions of the wafer and mask patterns and the distance between bars, and thus as a measure of alignment of the patterns on the mask with the pattern on the wafer. The signal-to-noise ratio of this system utilizing elongated bars and slots is substantially better than that for systems using spot beams or the like. By controlling the length of the bars and slots, good signal to noise of the pulses may be obtained.

In a preferred embodiment of this invention, only one bar is scanned at any one point in time, and thus a single sensor of simple design, such as photo-tube, is needed to product the pulse output, as distinguished from systems utilizing cathode ray tube scanners and photo tubes.

The system is provided with means for selecting one of several tolerances within which alignment between the mask pattern and wafer pattern will be accepted as satisfactory by the device.

FIGS. **6*a–d*** together form a block diagram of this wafer-mask aligning system.

Figure 7:
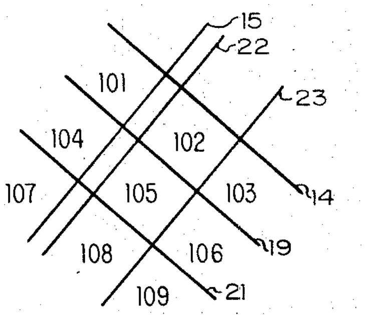

FIG. 7 is an illustration of the sectoring of the double-cross mask pattern area.

Figure 8:
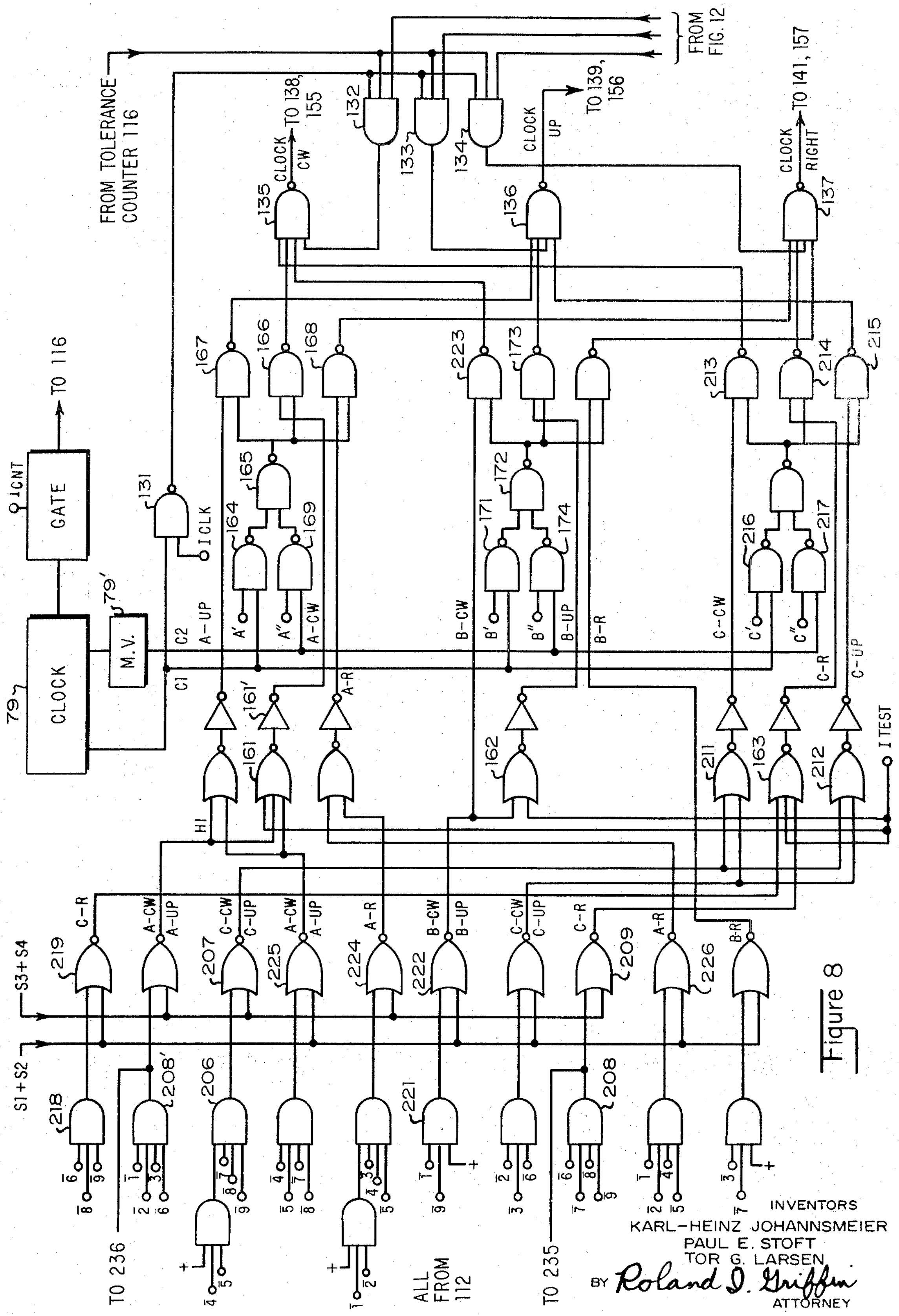
Figure 9:
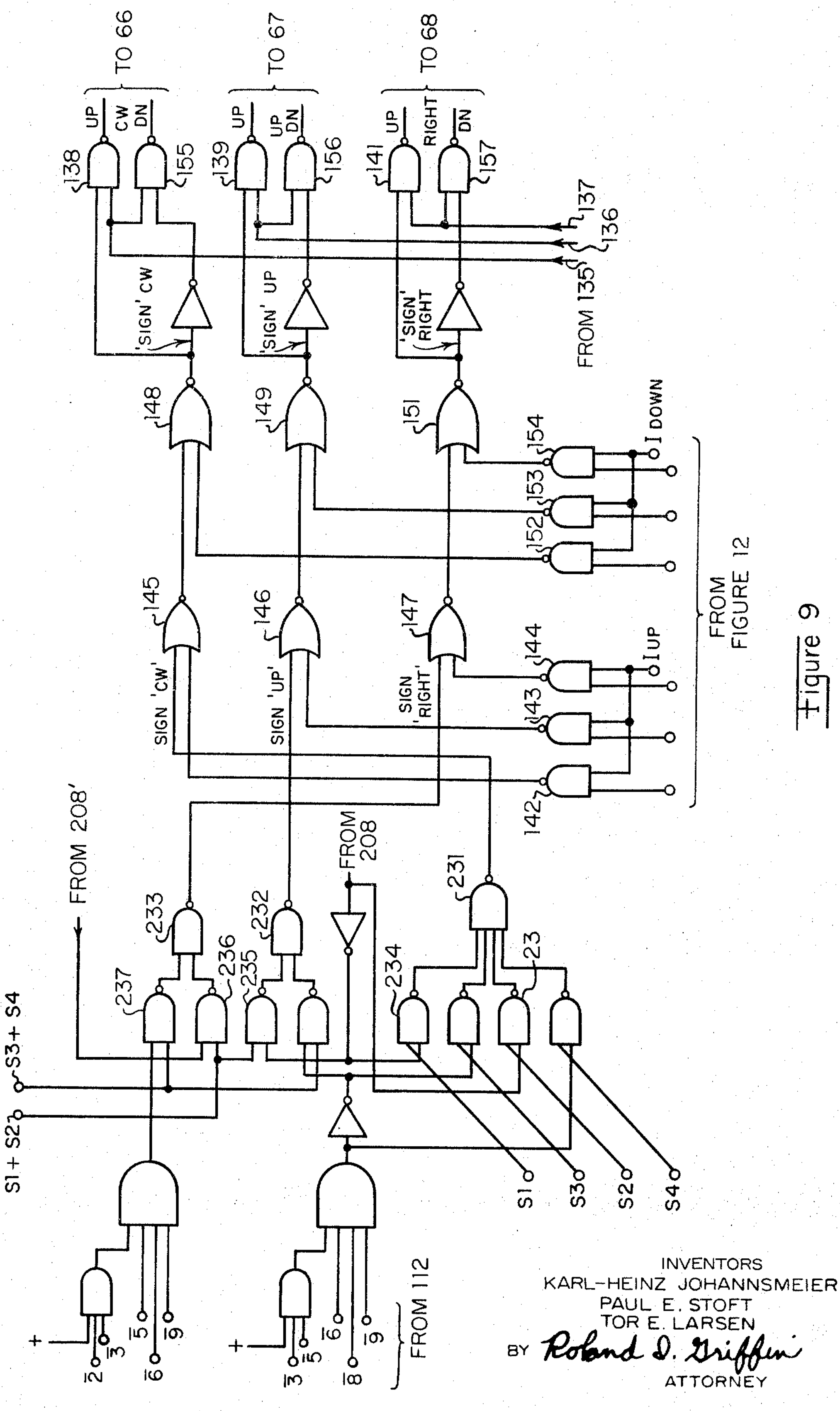

FIGS. 8 and 9 are schematic diagrams illustrating one form of logic circuitry which may be utilized in the formula magnitude determining network and counter input control circuit shown in FIGS. **6*c***.

Figure 10:
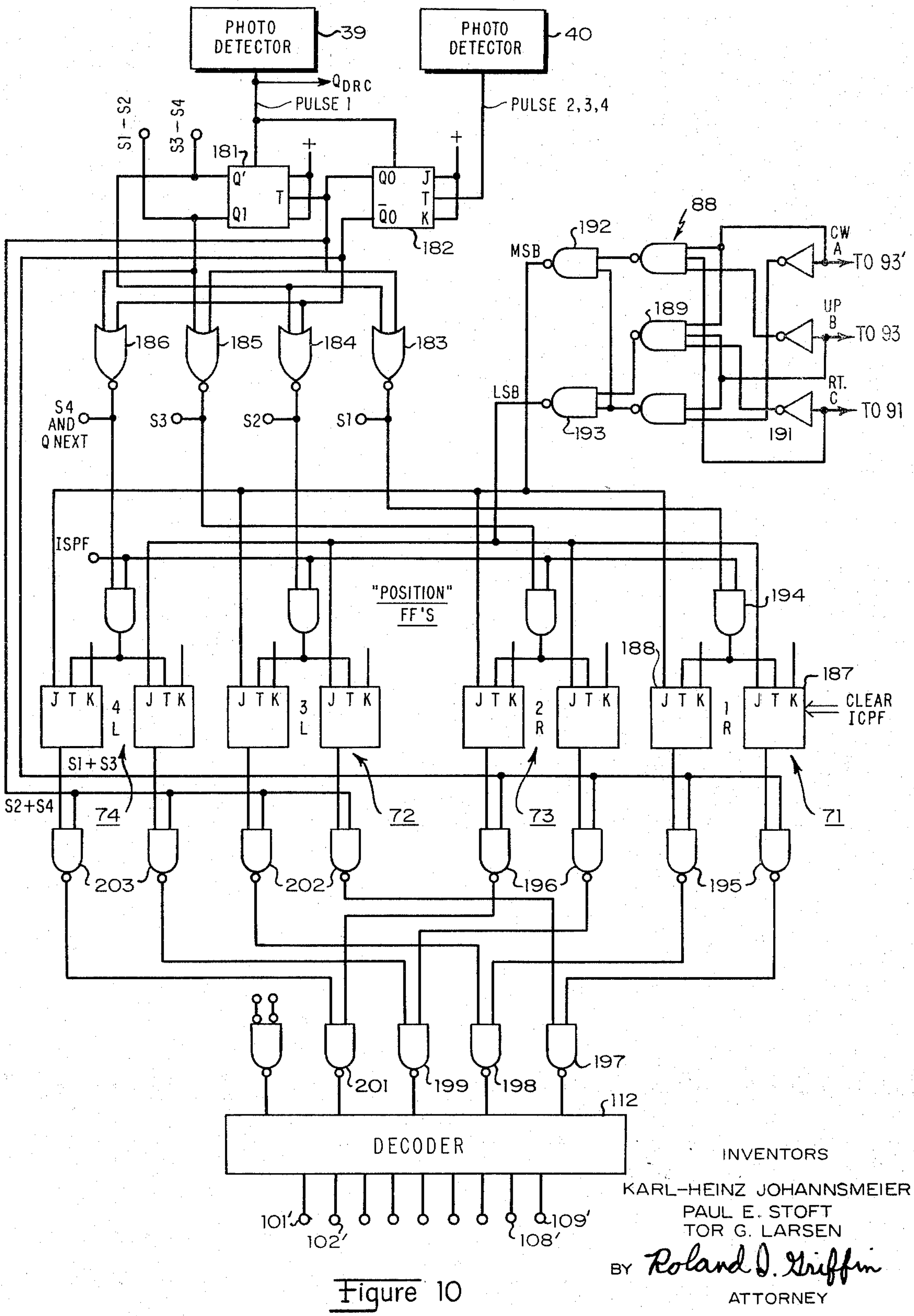

FIG. 10 is a schematic diagram of a logic circuit that may be employed for the pattern area position determining system of FIG. **6*a***.

Figures 6A, 6B:
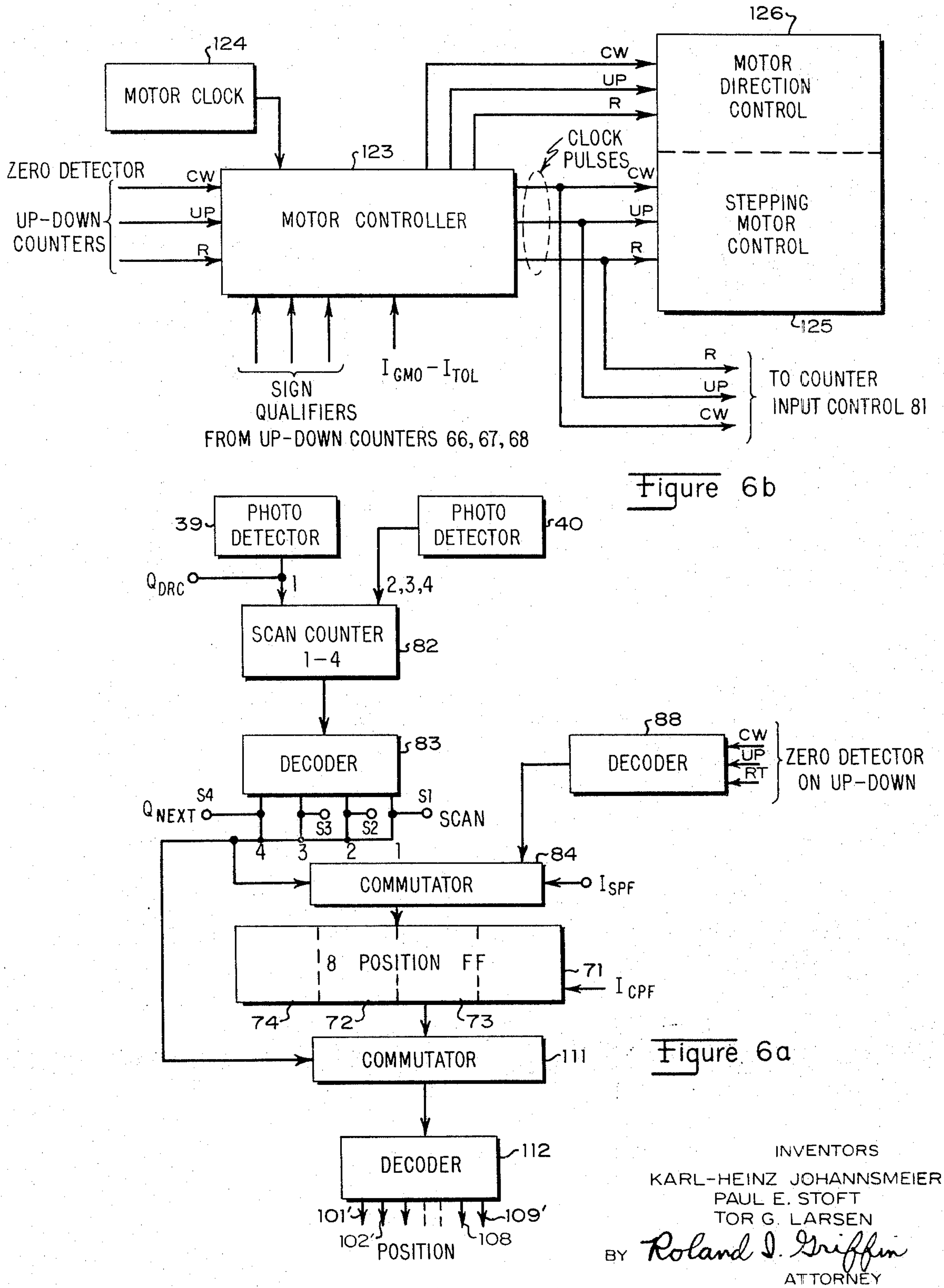
Figure 6C:
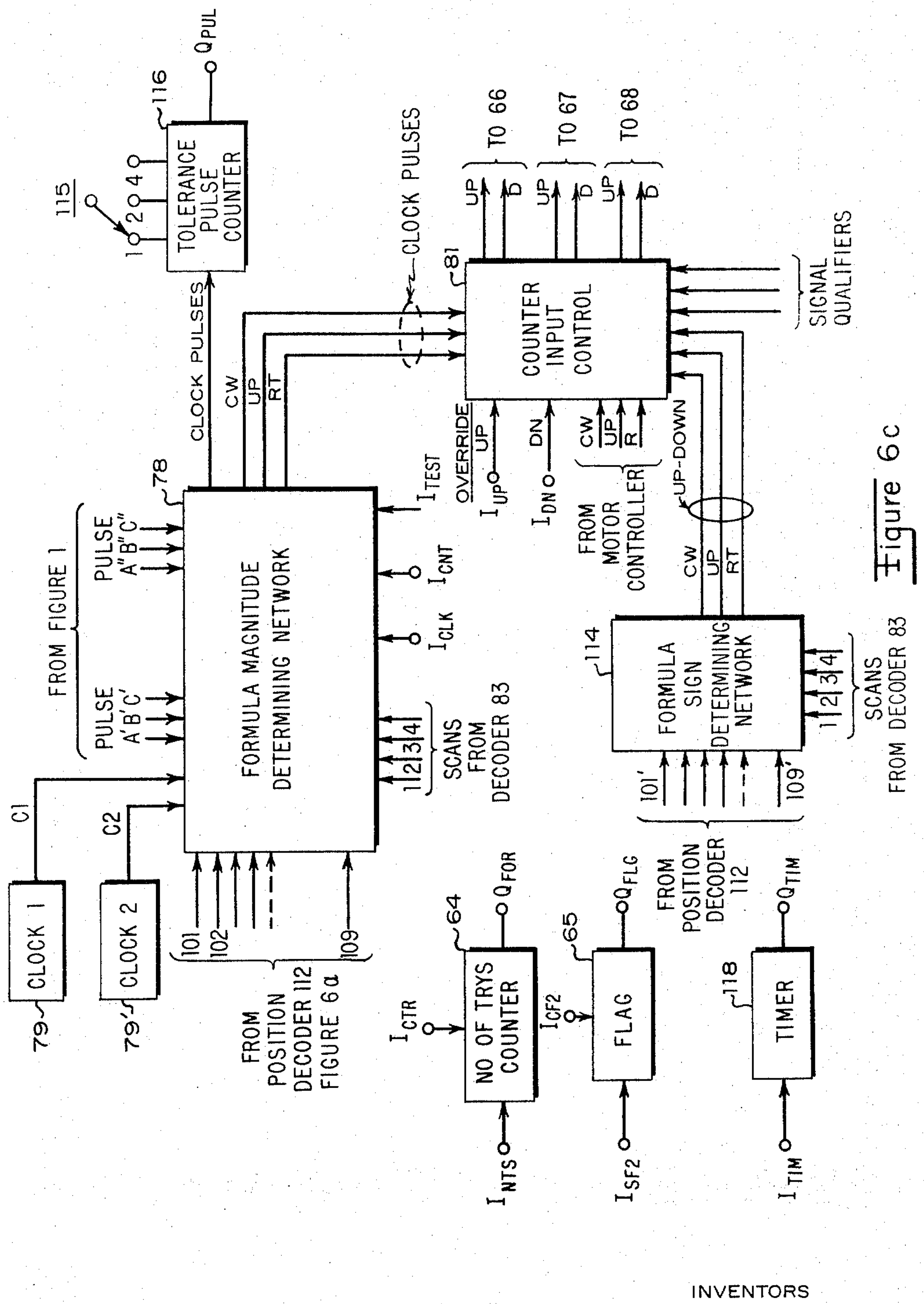
Figure 11:
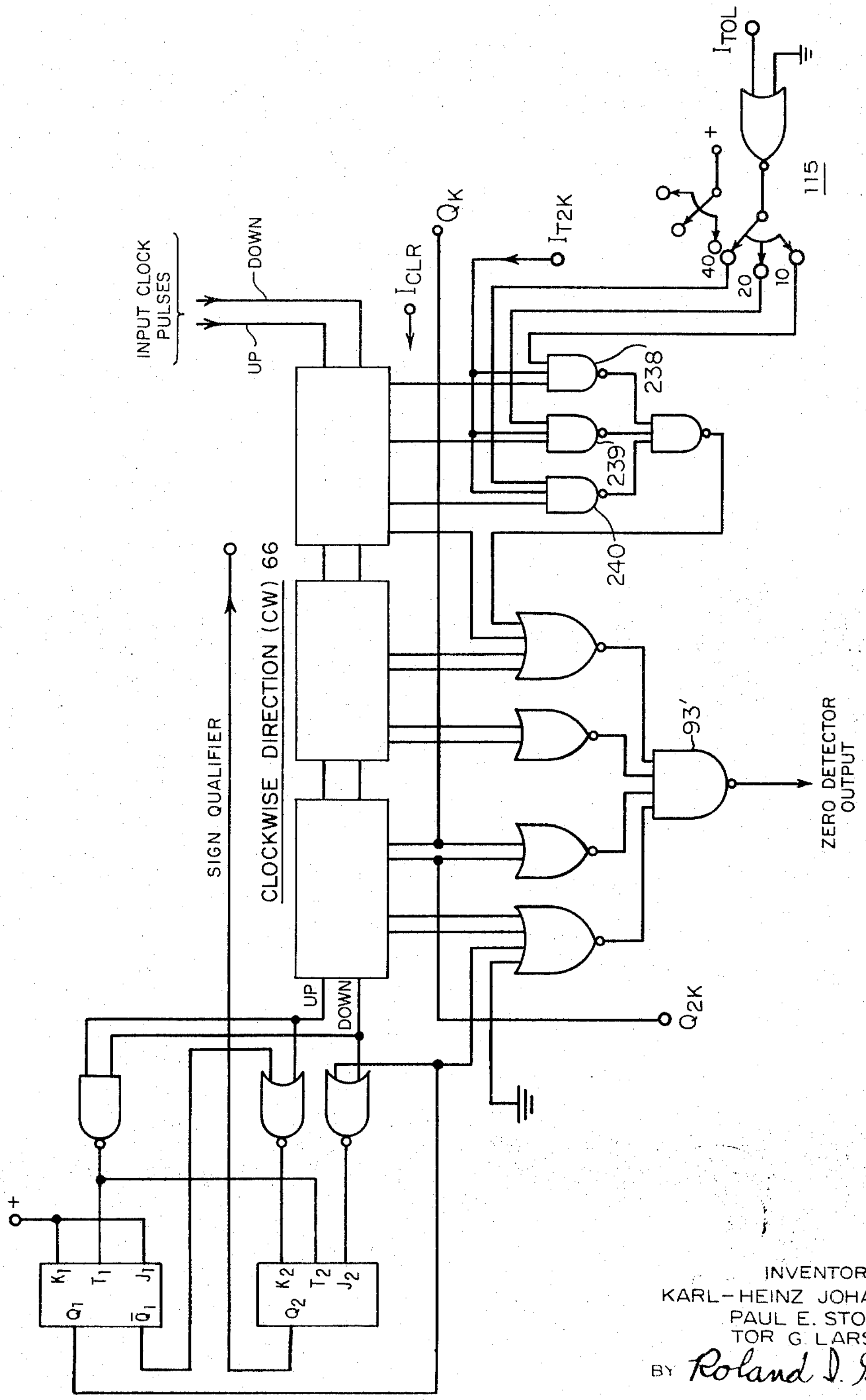
Figure 12:
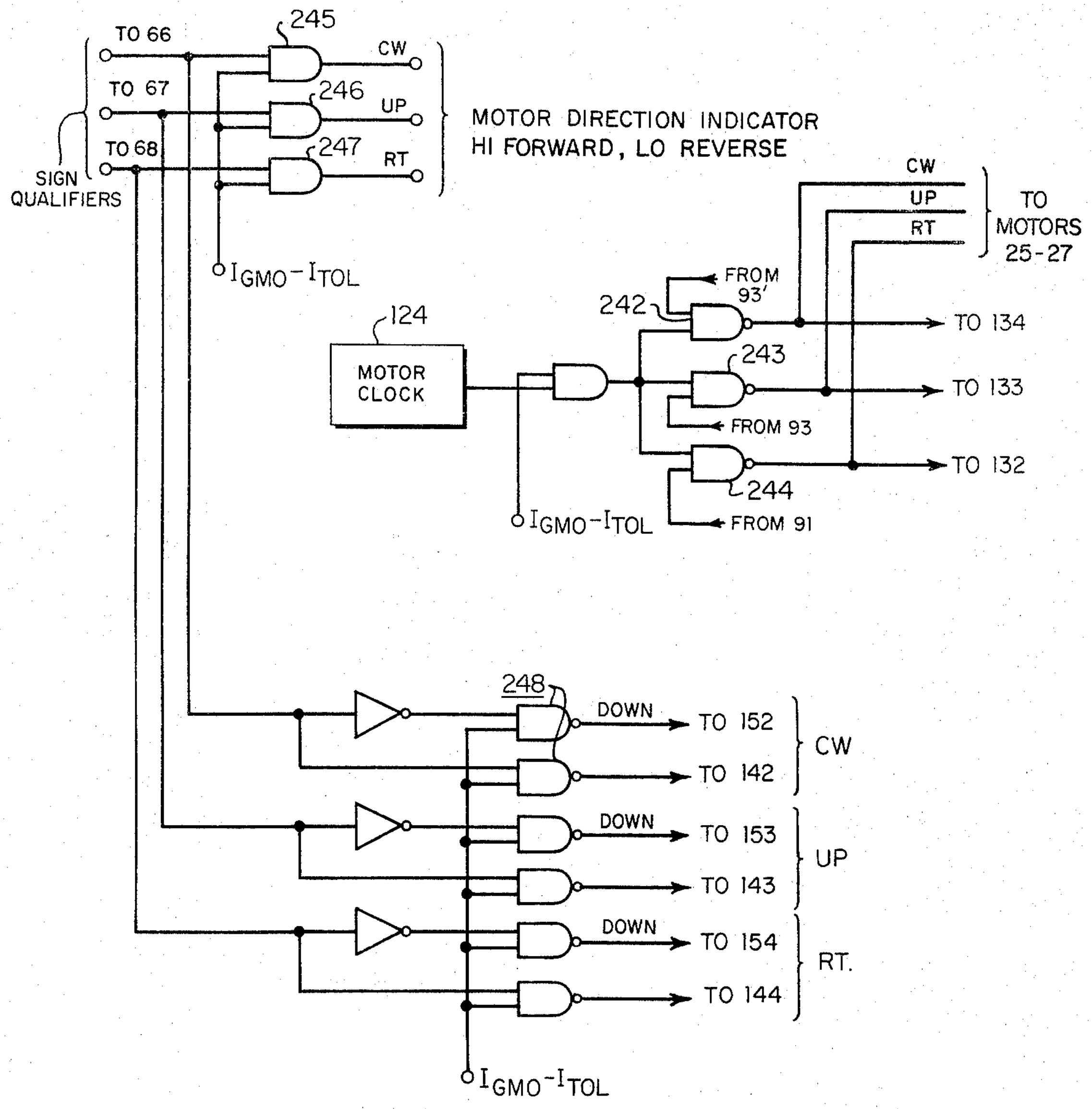

FIG. 11 is a schematic diagram illustrating one form of binary counter that may be used for the up-down direction counters of FIG. **6*d*, FIG. 12 is a schematic diagram of logic circuitry useful for the system of FIG. 6*b***.

Figures 1, 2, 3:
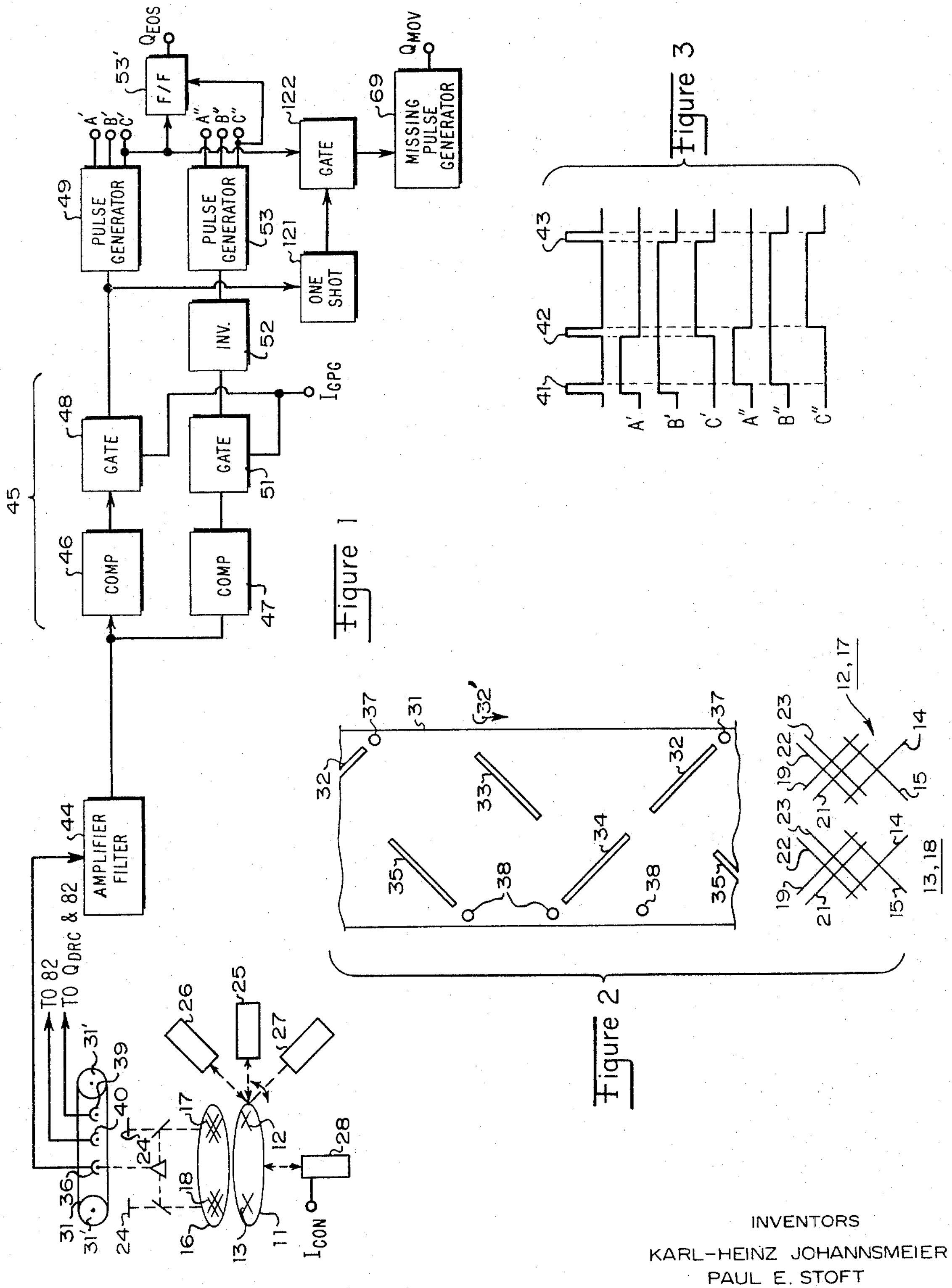
FIG. 1 is a block diagram of the mask and wafer pattern scanning system and related pulse generating components of a preferred embodiment of the present invention.
FIG. 2 is a view of the scanning belt and the two pattern areas scanned therewith.
FIG. 3 is a chart showing the pulses generated by the scanning system and pulse generating components of FIG. 1.
Figure 13:
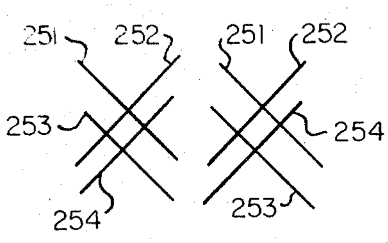
Figure 14:
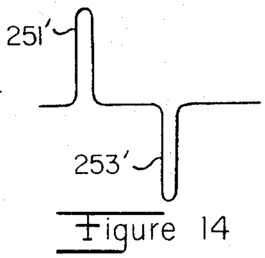

FIG. 13 is a mask and wafer pattern wherein the two pattern areas comprise a pair of single crosses for alignment in lieu of the pattern arrangement of FIG. 2, and FIG. 14 is a trace showing the positive and negative pulses obtained in a single scan of an associated pair of lines in the pattern of FIG. 13.

DESCRIPTION OF THE PREFERRED EMBODIMENTS

Referring now to FIGS. 1, 2 and 3, the semiconductor wafer 11 is provided with a pair of alignment patterns 12 and 13 on its upper surface, each pattern comprising a dark single cross consisting of bars 14 and 15, the patterns being spaced-apart near the ends of a diameter of the wafer. The bars 14 are at some convenient substantial angle, for example 90°, relative to the bars 15.

The transparent mask 16 is provided with a pair of alignment patterns 17 and 18 spaced apart along a diameter of the mask a distance equal to the separation of the patterns on the wafer, each pattern 17 and 18 consisting of a dark double cross comprising two pairs of parallel, closely spaced-apart bars 19 and 21 and 22 and 23. The bars 19 and 21 are directed at an angle relative to the bars 22 and 23 which is equal to the angle between bars 14 and 15 such that, when the mask is properly aligned over the wafer, the single crosses are located centrally within the double crosses, with the bars 14 parallel to and centered within the bars 19 and 21, and with a like relationship between bars 15 and 22 and 23. Other alignment relationships may be employed as discussed below.

As in conventional mask alignment machines, the wafer 11 and mask 16 are positioned in coarse alignment under a high powered microscope which provides a split-screen image of the two pattern areas for visual examination by the operator at focal points 24.

The operator may activate one or more of three reversible motor drive mechanisms, 25, 26 and 27, which will move the wafer in an X (right or left), Y (up or down), or rotational (clockwise or counterclockwise) direction, respectively to bring the wafer patterns 12, 13 into alignment with the mask patterns 17, 18, respectively. An air operated piston 28 serves to move the wafer 11 up into and away from contact with the mask 16.

In addition to the operator-controlled alignment, an automatic alignment system is provided and, for this purpose, a third split-screen image of the plurality of crosses of the two pattern areas 12, 17 and 13, 18 is produced at the optical image plane and coincident with a rapidly moving scanning belt 31, which is driven by drive wheels 31' to scan the pattern areas in the direction of the arrow 32 (see FIG. 2). The pattern areas 12, 17 and 13, 18 are magnified for example 10×1, the image size allowing an aquisition range of about 20×20 mils. The belt 32 actually scans in a direction normal to the direction depicted in FIG. 1, i.e. normal to the plane of the drawing as more clearly seen in FIG. 2.

The belt 31 is provided with two continuous rows of pairs of slots, the pairs of slots 32 and 33 of the right hand row scanning the image area of pattern 12, 17 while the pairs of slots 34 and 35 of the left hand row scan the image area of pattern 13, 18. Slots 32 and 33 of one row are offset equidistant between the slots 34 and 35 of the other row, the slots in each row alternating in direction such that alternate ones of the slots are collinear with associated bars in the alignment patterns. For example, the slots 32 and 34 extend in the same direction as the bars 14, 19 and 21 while the slots 33 and 35 extend along the direction of bars 15, 22 and 23.

A light sensor such as hot-cell 36 is positioned behind the belt 31 so as to intercept the light passing through the slots in the belt as the slots scan the areas of the image of the alignment patterns. As each slot passes each bar of the image oriented in the same direction as the slot, a pulse output is produced from the sensor 36. Therefore, as each slot 32 passes the three bars 14, 19 and 21, three output pulses are produced; no output is produced by the passage of slot 32 over bars 15, 22 and 23 since these dark lines extend transverse to the slot rather than collinear and a negligable amount of light is intercepted.

The scanning belt 31 is provided with a first row of holes 37, these holes being located just in front of every slot 32 in the first row of slots. A second row of holes 38 is provided in the belt, one hole being located before each of the next three slots 34, 33 and 35 in the belt. A photo-sensor 39 detects light passing through holes 37 from a suitable light source (not shown) while another photosensor 40 detects light through the holes 38, thus a pulse output is obtained from sensor 39 just before slot 32 scans pattern 12, 17 followed by three pulses from the other sensor 40, each pulse just before the next three scans by the three slots 34, 33 and 35, respectively. These pulses serve as described below to keep track of each series of scans of the two pattern areas 12, 17 and 13, 18, each series comprising a scan of area 12, 17 by one pair of slots 32 and 33 and a scan of area 13, 18 by the associated pair of slots 34 and 35.

As slot 32 sweeps past the bars 14, 19 and 21 of area 12, 17, a three pulse output from the photo-cell 36 is obtained. The time length between these three pulses 41, 42 and 43 (See FIG. 3) depends upon the position of the bar 14 relative to the two bars 19 and 21. For example, if the bar 14 is located below the two bars 19 and 21 a substantial distance (as shown in FIG. 2), the last pulse 43 produced from the bar 14 is separated a substantial time period from the first two pulses 41 and 42 obtained from the bars, 19 and 21, respectively, these latter two pulses being a fixed time period apart due to the fixed spacing between bars 19 and 21. Should the bar 14 be located above the two bars 19 and 21, the last two pulses 42 and 43 due to the bars 19 and 21 would be separated from each other by said fixed time period and they would be separated from the first pulse 41 due to the bar 14 by a time period dependent on the spacing between the bar 19 and the bar 14. During a period of close alignment when the bar 14 is positioned between the two bars 19 and 21, the timing between the first and third pulses 41 and 43 is said fixed time period and the pulse 42 due to bar 14 is spaced therebetween; it will be equally spaced in time from pulses 41 and 43 when the bar 14 is positioned midway between the bars 19 and 21 at optimum alignment.

As the next slot 34 sweeps past the bars 19, 21 and 14 of the second pattern area 13, 18 a second set of three pulses is produced, the relative positions and time spacing between the pulses again being dependent upon the location of the bar 14 relative to the two bars 19 and 21 of the second pattern area.

A third set of three pulses is then produced as the slot 33 sweeps past the pattern area 12, 17, the bars 15, 22 ad 23 producing pulses separated in time dependent upon the position of the bar 15 relative to the two bars 22 and 23. A fourth set of three pulses is then produced when the slot 35 sweeps past the bars 15, 22 and 23 in the patten area 13, 18 on the wafer and mask.

Thus, for each complete scan series of the two pattern areas of the wafer and mask, i.e. a sweep of pattern area 12, 17 with slots 32 and 33 and a sweep of pattern area 13, 18 with slots 34 and 35, four sets of three pulses each are created, the timing between the pulses in each set being uniquely related to the positions of the related aligning patterns on the mask relative to the aligning patterns on the wafer.

These sets of pulses are first passed through an amplifier-filter circuit 44 which serves to amplify the pulses and to remove extraneous noise. The pulses are passed through a squaring circuit 45 to improve the shape of the leading and trailing edges of each pulse, the square circuit comprising a pair of comparator circuits 46 and 47 which serve to produce three sharp positive pulse outputs in response to the three input pulses 41 – 43, these positive output pulses being produced in response to either positive or negative going input pulses. This insures proper operation if for any reason the photodetector scan system should deliver a negative pulse in lieu of a positive pulse as would be the case if one bar were opaque and another bar reflective.

The pulse output from comparator 46 is transmitted via gate 48 to pulse generator 49 and the pulse output of comparator 47 is sent via gate 51 and inverter 52 to the pulse generator 53. Pulse generators 49 and 53 operate in accordance with standard circuit techniques to produce output pulses A′, B′ and C′ and A″, B″, and C″, respectively, in response to the input pulses 41 – 43, these pulses being related to the leading and trailing edges of the input pulses 41 – 43 as shown in FIG. 3. Thus, pulse A′ extends from the leading edge of the first pulse 41 to the leading edge of the second pulse 42, pulse B′ extends from the leading edge of the first pulse 41 to the leading edge of the third pulse 43, and pulse C′ extends from the leading edge of the second pulse 42 to the leading edge of the third pulse 43. In the second group of three pulses, pulse A″ extends from the trailing edge of the first pulse 41 to the trailing edge of the second pulse 42, pulse B″ extends from the trailing edge of the first pulse 41 to the trailing edge of the third pulse 43, and pulse C″ extends from the trailing edge of the second pulse 42 to the trailing edge of the third pulse 43.

If we assume that pulse 41 is made by bar 14 and pulses 42 and 43 are made by bars 19 and 21, respectively, then pulse C′ will be of a predetermined length established by the predetermined distance between the bars 19 and 21 while pulse A′ will be of a time length directly dependent upon the variable spacing between the bar 14 and the bar 19; the greater the spacing, the longer the time span of pulse A′. The length of pulse B′ will be dependent upon the distance between the bar 14 and bar 21.

A similar relationship exists with regard to the pulses A″, B″, and C″ except they are formed from the trailing edges of pulses 41, 42 and 43; a combination of the pulses A′, B′, and C′ with the pulses A″, B″, and C″, respectively, results in a pulse averaging effect as seen hereafter.

It should be noted that the scanning system may take other forms. For example, a slotted drum could be used in lieu of the belt. Two separate belts could be employed, one for each of the pattern areas 12, 17 and 13, 18. The belt 31 could be replaced with a suitably slotted plate that oscillates back and forth over the pattern areas, with appropriate logic circuitry to accommodate the alteration in direction of each scan.

The pattern areas may also take different forms. For example, the lines or bars need not be continuous, they may be broken provided the scanning means is modified, if needed to scan the broken lines. As an illustration, the double cross may consist of four right angles with their apexes extending in toward a common point center and each from a different one of four quadrants, the sides of the angles being spaced-apart the desired preselected distance.

To aid in visual alignment, a very small double cross may be located in the center of the major double cross 19, 21 and 22, 23 which will frame the center portion of the single cross 14, 15 at alignment. The small size of this added double cross will insure that no effect will be produced in the scanning pulses.

Figure 4:
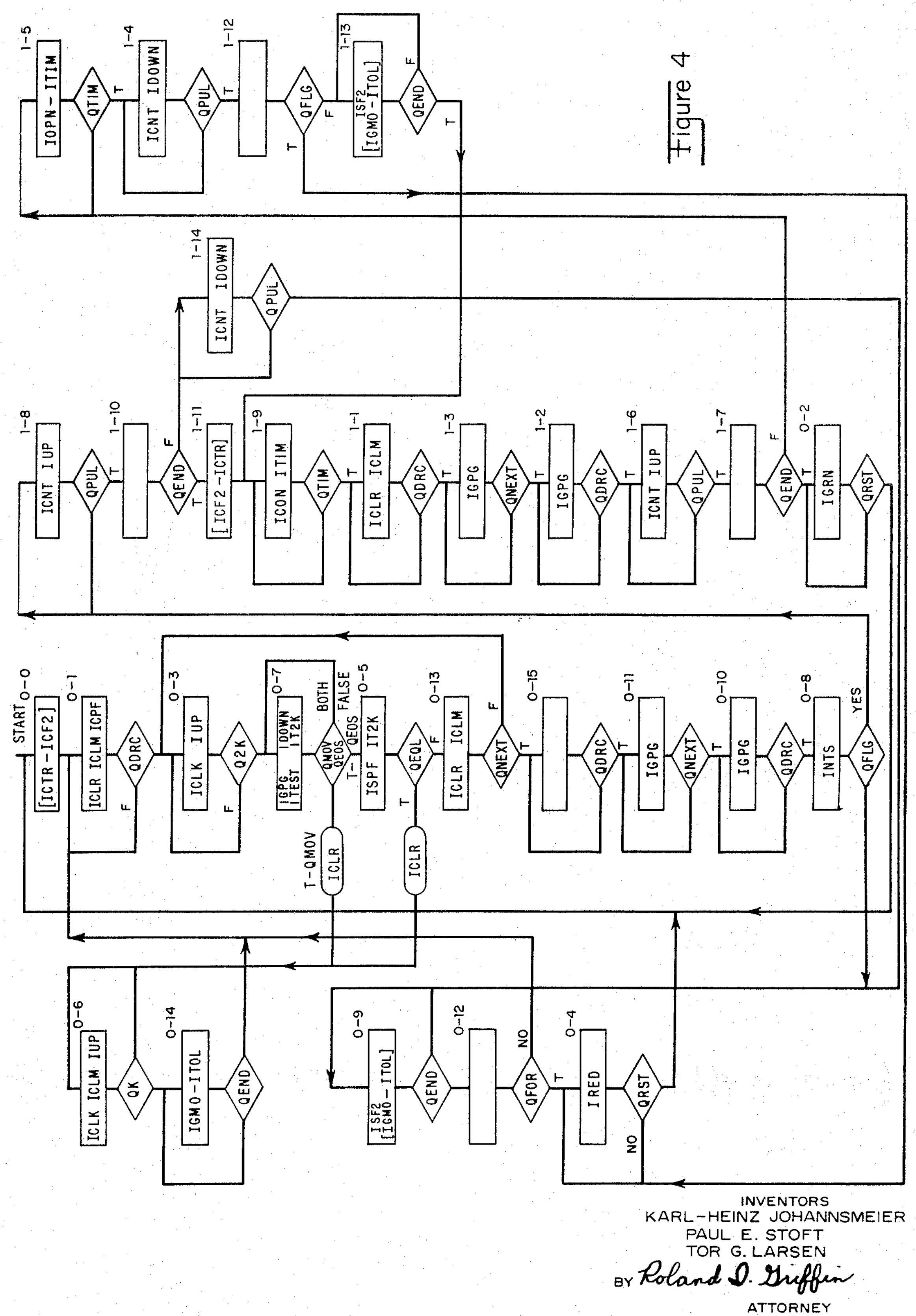
FIG. 4 is a flow chart illustrating the sequence of operation of this mask-wafer aligning system.
Figure 6D:
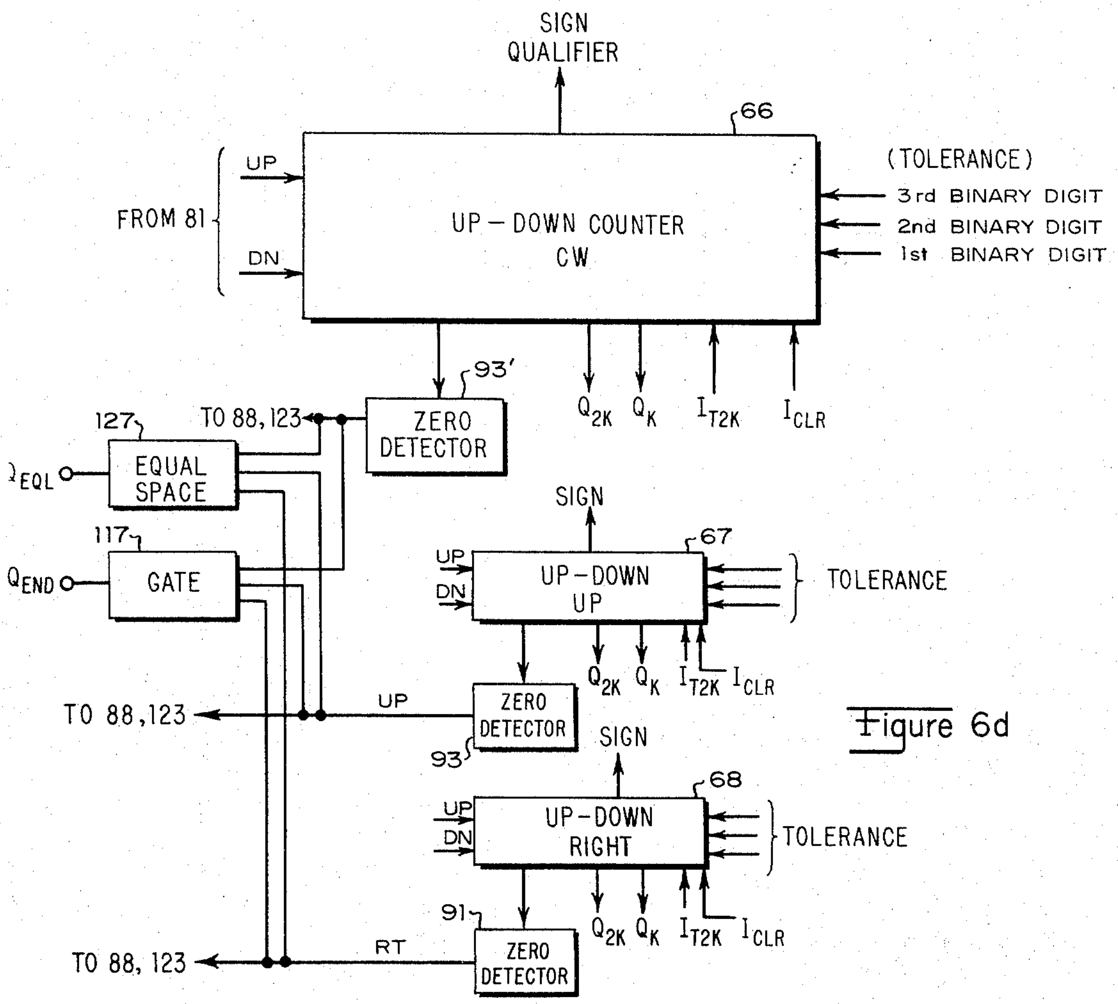
Figure 5:
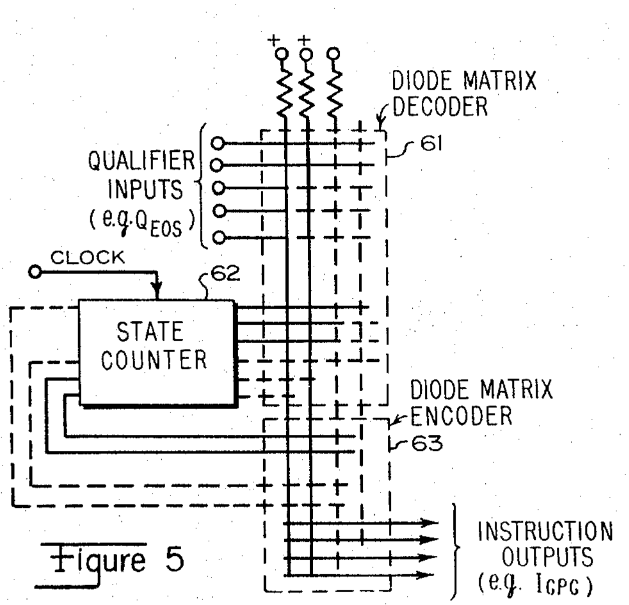
FIG. 5 is a schematic diagram illustrating one form of logic control circuit including state counter, decoder and encoder utilized in this system.

Referring now to the flow chart of FIG. 4, the control circuit comprising decoder 61, state counter 62, and encoder 63 shown in FIG. 5, and the block diagram of FIGS. 6*a–d*, the automatic aligning sequence of the present invention is initiated after the mask has been coarsely aligned over the wafer, the drive mechanism 28 being in the lower-most position to hold the wafer spaced-apart slightly from the mask. At the start of operations, the state counter 62 is in an initial state, for example 0—0, and subsequently changes to the next state, 0–1. In state 0—0, a true output of the [$I_{CTR}$ + $I_{CF2}$] terminal or instruction output of the encoder circuit 63 serves to clear the "No. of Trys" counter 64 and clear the flag circuit 65, placing a true on its $Q_{FLG}$ output. In state 0—1, a true output on the encoder 63 terminal $I_{CLR}$ + $I_{CPF}$ + $I_{CLM}$ serves to clear the binary coded decimal up-down counters 66, 67 and 68 (FIG. 6d), the missing pulse generator flip-flop 69 (FIG. 1), the pulse generators 49 and 53 (FIG. 1) and the position flip-flop circuits 71–74 (FIG. 6a).

The pulse output from the photosensor 39 associated with the hole 37 in the belt 31 positioned just before the first slot 32 in the first scan series results in a true input on the qualifier input $Q_{DRC}$ to the decoder circuit 61, the control circuit operating on receipt of the next clock pulse to change the state counter 62 to state 0–3 to place a true output on the instruction output leads $I_{CLOCK}$ and $I_{UP}$. A high on the input $I_{CLK}$ operates formula magnitude determining circuit 78 to transmit pulses C1 from the clock 79 to the counter input control circuit 81 which is operated by $I_{UP}$ to transmit the clock pulses C1 to the up-count inputs of the clockwise, up, and right direction up-down counters 66, 67 and 68, respectively.

These three counters will count up together in response to the C1 clock pulses until all three have counted up to 2K, where 2K is the number of clock pulses representing the fixed vertical spacing between the two parallel bars 19 and 21 on the transparent mask 16. When the up-down clockwise counter 66 has reached 2K, it places a true on the $Q_{2K}$ input of decoder 61 to change the state counter 62 to the next state, for example 0–7, terminating $I_{CLK}$ to cut off the flow of clock pulses; the three counters 66 – 68 come to rest with a 2K count registered in each. Four of the instruction outputs from the encoder 63 are activated, i.e., $I_{GPG}$ to activate gates 48 and 51 to open the path for the pulses 41, 42 and 43; $I_{DOWN}$ to activate the three count down paths in counter input control circuit 81 to insure that the following clock pulses will pass to the count down input of the three up-down counters 66, 67 and 68; $I_{TEST}$ to network 78 which serves to direct the clock pulses to the clockwise, up, and right direction counters 66 – 68 as described below, and $I_{T2K}$ to the up-down counters 66 – 68.

At the time the photosensor 39 operated to produce $Q_{DRC}$ it also produced an output to clear the scan counter circuit 82 (FIG. 6a) which operates via decoder 83 and commutator 84 to condition the first pair 71 of four pairs of position flip-flop circuits 71 – 74 for receipt of the two bits from decoder circuit 88 indicating the position of the pattern 17 relative to the pattern 12 after the scan by slot 32 as described below.

As the first slot 32 in the belt passes over the pattern area 12, 17, the three pulses 41, 42 and 43 produced thereby are transmitted to the pulse generators 49 and 53 which operate to form the two sets of pulses A′–C′ and A″–C″, respectively, as described above. We will assume in this illustration that the patterns 12, 17 are aligned so that bar 14 is above bars 19 and 21, pulses A′ and A″ representing the distance between bars 14 and 19, pulses B′ and B″ representing the distance between bars 14 and 21, and pulses C′ and C″ representing the distance between bars 19 and 21. These two sets of pulses are transmitted to the formula magnitude determining network 78 which operates to transmit the clock pulses C1 and C2 to the down input of clockwise direction counter 66 during the combined time of pulse periods A′ and A″, (hereinafter referred to as pulse A) to the down input of the up direction counter 67 during the combined time of pulses B′ and B″ (hereinafter referred to as pulse B), and to the down input of the right direction counter during the combined time periods of pulses C′ and C″ (hereinafter referred to as pulse C).

In this manner, as the slot 32 scans the bars 14, 19 and 21, the three up-down counters 66, 67, 68 count down from the 2K count that had been registered in each of the counters before the initiation of the scan by slot 27. Since it was assumed in this illustration that bar 14 was located above the bars 19 and 21, pulse C represents the distance between bars 19 and 21 and, during the existence of pulse C, 2K clock pulses will be delivered to the right direction up-down counter 68. Thus, at the end of pulse C this right direction up-down counter 68 will have counted down to zero. Because of the longer length of the pulses A and B, the clockwise direction and the up direction up-down counters 66 and 67 will both have counted down more than 2K clock pulses and thus the stored count therein will be something other than zero.

The $I_{T2K}$ activates on override circuit in each up-down counter 66 – 68 so that the first three binaries in the registered count after the count down from 2K will be ignored in testing for zero in the zero detectors 91, 93, and 93′. In this way, a tolerance of eight (store is permitted to allow for possible variances in the vertical distance between bars 19 and 21 on the different masks.

The zero detector circuit 91 operates to produce a two bit output from decoder circuit 88 (FIG. 6a) indicative of the zero count down of right direction counter 68.

At the end of the pulse C″, the pulse generator 53 operates flip-flop 53′ to place a true on the $Q_{EOS}$ input of the decoder 61 to change the state of counter 62 to the next state, e.g. 0–5, and to place a true on the $I_{SPF}$ ascribable position flip-flop) to commutator circuit 84 which operates to store the two bits from the decoder 88 into the first flip-flop circuit 71.

In those instances where bar 14 is located between bars 19 and 21, pulse B represents the distance between bars 19 and 21, and the up-direction up-down counter 67 counts down 2K to zero, causing the output of its zero detector 93 to go true resulting in a different pair of bits being stored in the position flip-flop circuit 71 from decoder 88.

When bar 14 is below the two bars 19 and 21, i.e. scanned last by slot 32, pulse C represents the distance between bars 19 and 21, and the clockwise direction up-down counter 66 counts down 2K to zero, resulting in a still different pair of bits being stored in the position flip-flop 71.

Therefore, depending on whether the bar 14 is above, between, or below the two bars 19 and 21, a particular pair of bits, e.g. bits 1—1, 1–0, or 0–1, respectively, are stored in the first position flip-flop circuit 71 as a record of this positioning.

After storage of the two bits in the position flip-flop circuit 71, the state counter 62 changes to its 0–13 state as a result of a false on the $Q_{EQL}$ input from the equal space circuit described below, resulting in outputs from encoder 63 which serve to clear the up-down counters 66, 67 and 68, clear the pulse generators 49, 53, and clear the missing pulse generator flip-flop 69. The state counter then changes back to its 0–3 state to initiate the $I_{CLK}$ and $I_{Up}$ signal outputs from the encoder 63 and reactivate the 2K up count to counters 66 – 68 prior to the scan of the left hand pattern area by the second slot 34.

Before the scan of pattern area 13, 18 by slot 34, a pulse output from photosensor circuit 40 due to the passage of the hole 38 between slots 32 and 34 operates the scan counter circuit 82, decoder 83, and commutator 84 to condition flip-flop circuit 72 to receive the next two bits from decoder 88 indicating the position of the pattern 18 relative to the pattern 13 after the scan by slot 34.

As slot 34 scans bars 14, 19 and 21 of pattern area 13, 18, the three pulse periods A, B, and C are produced as described above and, as with the scan by slot 32, pulse A controls the clock pulse flow to the clockwise counter 66, pulse B controls the clock pulse flow to the up-direction counter 67, and pulse C controls the clock pulse flow to the right-direction counter 68. One of these three counters will count down to zero dependent on the location of bar 14 relative to bars 19 and 21, i.e. above, between, or below, and bits 1—1, 1–0, or 0–1, respectively, will be stored in flip-flop circuit 72.

A similar clearance of the counters, 2K count storage, and scan be slots 33 and 35 of bars 15, 22 and 23 in pattern areas 12, 17 and 13, 18, respectively, results in the production and storage of one of three possible pairs of bits in each of the third and fourth position flip-flop circuits 73 and 74.

Therefore, the positions of the two bars 14 relative to the associated bars 19, 21 and two bars 15 relative to the associated bars 22 and 23 are stored in the form of bit pairs in the four position flip-flop circuits 71 – 74 as a result of the first complete scan of the two pattern areas by the four slots 32 – 35.

During the scan by the fourth slot, a true appearing on the $Q_{NEXT}$ output from decoder 83 to decoder 61 changes the state counter 62 to state 0–15. On receipt of the pulse from photosensor 39 on input $Q_{DRC}$ at the beginning of the next scan series, the state counter 62 changes to state 0–11 and energizes the $I_{GPG}$ output of the encoder 63 to the gates 48, 51 to permit the next series of scan pulses to pass to the pulse generators 49 and 53.

In the case where bar 14 is located above bars 19 and 21 in pattern area 12, 17 and bar 15 in the same pattern area is above bars 22 and 23, the two pairs of bits 1,1 and 1,1 are stored in the first and third position flip-flop circuits 71 and 72. If the mask pattern is divided into the nine sectors 101–109 as shown in FIG. 7, then bar 14 lies along sectors 101, 102 and 103 and bar 15 lies along sectors 101, 104, and 107; the two bars 14 and 15 share the one sector 101.

The first pulse from sensor 39 at the start of the next scan series operates scan counter 82 and decoder 83 to signal commutator 111 to transmit the four bit information stored in flip-flop circuits 71 and 73 to the decoder circuit 112, where the single output 101′ is made true. This true output signifies that the two bars 14 and 15 share the one sector 101 in common. The other eight output leads 102′–109′ of the decoder correspond to the other eight sectors 102–109, respectively.

As the following scan by slot 34 occurs, the first pulse from photosensor 40 results in an operation of scan counter 82, decoder 83 and commutator 111 to transfer the four bit information from flip-flop circuits 72 and 74 through to the decoder 112.

In similar manner, the two subsequent pulses from photosensor 40 function as described above to operate the position flip-flop circuits 71, 72 and 73, 74 to produce an output on one lead of the decoder 112 for each scan, the particular bits stored in the position flip-flop circuits determining the particular one output lead to be activated.

As an illustration of the formula calculation, assume that line 109′ is made true for the first and third scans. A true on line 109′ and a true on the Scan 1 input (S1) from decoder 83 activates the formula magnitude determining network 78 to direct clock pulses C1 and C2 from the clocks 79 and 79′ through the counter input control circuit 81 to the three up-down counters 66 – 68 during the existence of pulse period C on the C′ C″ inputs to circuit 78.

On the third scan, with line 109′ again true and scan S-3 true, clock pulses C1 and C2 are passed to the clockwise direction counter 66 during pulse period B, to the up-direction counter 67 during pulse period B, and to the right direction counter 68 during pulse period C.

Assume that line 104′ is activated for the second and fourth scans. On the second scan S2, the clock pulses C1 and C2 would be transmitted to the right direction counter 68 during pulse A and to both the clockwise and up-direction counters 66 and 67 during pulse C. On the fourth scan S4 the clock pulses flow to the clockwise, up and right direction counters during pulse A.

The sign for the clockwise, up, and right counters 66, 67 and 68 is determined by the formula sign determining network 114 which directs the counters 66 – 68 to count either up or down. With an up count registered in the counters, the wafer motor drives will be moved in the clockwise, up and right directions, whereas with a down count registered, the wafer motor drives will be moved in the counterclockwise, down, and left directions.

During the scan by slot 32, with outputs 109′ and S1 true, the clock pulses are directed to the "up" inputs of the clockwise, up and right direction counters, 66, 67 and 68, respectively. Thus, on the scan 1 by slot 32 with lead 109′ true, all the counters count up.

The following table gives the formula calculations performed by circuits 78 and 114 to obtain the instructions to feed to the driving motors to move the wafer into alignment with the mask.

| Common Sector Number | Clockwise Direction Formula $\frac{Y_R-Y_L}{4}$ | | Up Direction Formula $\frac{Y_R+Y_L}{4}$ | | Right Direction Formula $\frac{X_R+X_L}{4}$ | |
|---|---|---|---|---|---|---|
| | $Y_R$ | $-Y_L$ | $Y_R$ | $+Y_L$ | $X_R$ | $+X_L$ |
| 101 | $-A_1-B_3$ | $+A_2+B_4$ | $-A_1-B_3$ | $-A_2-B_4$ | $-A_1+A_3$ | $-A_2+A_4$ |
| 102 | $-A_1-C_3$ | $+A_2+C_4$ | $-A_2+C_4$ | $-A_1-C_3$ | $-$ | |
| | | $A_2-C$ | | | $-A_1-A_3$ | $-A_2-A_4$ |
| 103 | $-A_1+C_3$ | $+A_2-C_4$ | $-A_1+C_3$ | $-A_2+C_4$ | $-A_1-B_3$ | $-A_2-B_4$ |
| 104 | $-C_1-A_3$ | $+C_2+A_4$ | $-C_1-A_3$ | $-C_2-A_4$ | $+A_1+A_3$ | $+A_2+A_4$ |
| 105 | $-C_1+A_3$ | $+C_2-A_4$ | $-C_1-A_3$ | $-C_2+A_4$ | | |
| | | $+A_1-AAO3$ | | | | $+A_2-A_4$ |
| 106 | $+A_1+C_3$ | $-A_2-C_4$ | $+A_1+C_3$ | $+A_2+C_4$ | $-C_1-C_3$ | $-C_2-C_4$ |
| 107 | $+C_1-A_3$ | $-C_2+A_4$ | $+C_1-A_3$ | $+C_2-A_4$ | $+C_1+B_3$ | $+C_2+B_4$ |
| 108 | $+C_1+A_3$ | $-C_2-A_4$ | $+C_1+A_3$ | $+C_2+A_4$ | $+C_1+C_3$ | $+C_2+C_4$ |
| 109 | $+C_1+B_3$ | $-C_2B_4$ | $+C_1+B_3$ | $+C_2+B_4$ | $+C_1-{c3}$ | $+C_2-C_4$ |

To illustrate, assume the right hand patterns 12, 17 are positioned so that the bars 14 and 15 intersect in sector 103 and the left hand patterns 13, 18 are positioned so the bars 14 and 15 intersect in sector 106. The clock pulse counts to be sent to the clockwise, up, and right direction counters are determined as follows.

For the clockwise counter the formula is $Y_R - Y_L/4$. From the above table, the count for scan 1, right hand pattern, sector 103 is given by $-A_1$; the count occurs during pulse A and the negative sign indicates a down count, the subscript 1 indicating the scan number. The count for scan 2 (from Sector No. 106 in the table) is $-A_2$ which indicates a down count during pulse A. The count for scan 3 is $+C_3$, an up count during pulse C. The count for scan 4 is $-C_4$, a down count during pulse C. The clockwise counter formula is, therefore, $$\frac{Y_R - Y_L}{4} = \frac{-A_1 - A_2 + C_3 - C_4}{4}$$

The up direction count formula determined from sectors 103 and 106 is:

$$\frac{Y_R + R_L}{4} = \frac{-A_1 + A_2 + C_3 - C_4}{4}$$

The right direction count formula is:

$$\frac{X_R + X_L}{4} = \frac{-A_1 - C_2 - B_3 - C_4}{4}$$

During the second series of four scans, therefore, clock pulses are transmitted to and recorded in the three counters 66 – 68 in accordance with the above formula and depending on the pattern positioning indicated on the outputs of decoder 112.

At the initiation of scan 4 in the second series, the true on the $Q_{NEXT}$ input to decoder 61 changes the state counter to state 0–10. After scan 4 and in response to the next $Q_{DRC}$ pulse from sensor 39, the state counter changes to state 0–8 and activates output $I_{NTS}$ to register a one count in the No. of Trys counter 64 as an indication that the formula has been determined for the first time. In this state, if the $Q_{FLG}$ output of the flag flip-flop 65 is true, i.e. the flag is set and not clear, state counter changes to state 1–8 and the encoder 63 activates outputs $I_{CNT}$ to circuit 78 and $I_{UP}$ to counter input control 81.

At this stage, the device tests to determine if the alignment of the mask and wafer are within acceptable tolerances. For example, if the counts registered in all three counters 66 – 68 after the formula determination are zero, then optimum alignment has occurred and no movement of the wafer is necessary. Also, if the three counts are all within some predetermined tolerance, alignment is acceptable and no movement necessary. The operator may set the tolerance by means of a switch 115, for example, a tolerance in any direction of ± 10 μin., ± 20 μin. or ± 40 μin.

The tolerance test circuit, in determining if the alignment is within a tolerance of ±40 μin., ignores the last three counts in each counter and looks at the fourth and greater counts. A binary code received of 0000—0000–0111, indicating a count of 7, would signify a measurement within tolerance, since all the binaries above the third are zero, whereas 0000—0000–1000, or 8, would be outside tolerance since the fourth binary is 1. However, if the misalignment were in the other direction, and the binaries indicated a numerical count of 996, the binaries would indicate out-of-tolerance when in fact it is within tolerance. To overcome this latter problem, before the tolerance test, counts are added to the final count in each of the three counters 66 – 68. In the case of a tolerance of ±40 μin. three binaries are ignored and four counts are added; for a tolerance of ±10 μin. one binary is ignored and one count is added; for a tolerance of ±20 μin. two binaries are ignored and two counts are added.

The networks 78 and 81 therefore operate in response to $I_{CNT}$ and $I_{UP}$ to deliver the tolerance count of one, two, or four pulses, determined by the tolerance count setting, to the up input of each of the counters 66 – 68, after which an output appears at $Q_{PUL}$ of the tolerance pulse counter 116 to signify the end of the pulses.

The $Q_{PUL}$ operates the state counter 62 to change to state 1–10 and test the output of the zero test gate 117, which will be true if the zero detector circuits associated with each of counters 66 –68 signify that all of the binaries above the third (for a four count tolerance) in each counter are zero, and that, therefore, all measurements are within tolerance.

If all are within tolerance, the $Q_{END}$ output operates the state counter 62 to the next state 1–11, and a true output appears on $I_{CF2}$ – $I_{CTR}$ of the encoder 63 to clear the No. of Trys counter 64 and the flag flip-flop 65.

The state counter 62 changes to state 1–9 and activates the $I_{CON}$ and $I_{TIM}$ outputs of encoder 63, the $I_{CON}$ signal serving to activate the motor drive 28 which moves the wafer vertically up into contact with the mask. The timer circuit 118 is activated by $I_{TIM}$ and produces a delayed output $Q_{TIM}$, for example, 0.2 seconds, sufficient to enable mask-wafer contact to take place.

The $Q_{TIM}$ input to decoder 61 changes the state counter 1—1 to activate $I_{CLR}$ to clear the up-down counters 66 – 68, the missing pulse generator 69, and the pulse generators 49, 53, and reset the third pulse flip-flop 53'.

The device now rechecks the alignment of the mask and wafer to insure that, in moving into contact, they did not shift out of alignment. Therefore, in response to the next $Q_{DRC}$ signal from the scan belt sensor 39, the state counter changes to state 1–3 and activates $I_{GPG}$ to gate the scan pulses to the pulse generators 49, 53. The two position-indicating outputs, for example 109' and 104', from decoder 112 are still activated, and three new formulas are determined and the computed pulse counts stored in counters 66 – 68 in accordance with the positioning of the mask and wafer patterns. At the start of the fourth scan in this series, the $Q_{NEXT}$ output changes the state counter to state 1–2, maintaining $I_{GPG}$ activated and preparing the control circuit decoder 61 for receipt of the $Q_{DRC}$ pulse at the end of this scan series.

On receipt of $Q_{DRC}$, the state counter changes to state 1–6 and outputs $I_{CNT}$ and $I_{UP}$ are made true to add the tolerance pulse counts to the three counters 66 – 68 as described above. The $Q_{PUL}$ output signifies the end of the tolerance pulses and changes the state counter to 1–7.

If the zero detector outputs from the three counters 66 – 68 all register a zero count, the $Q_{END}$ output is activated to change the state counter to 0–2, lighting a green lamp to indicate to the operator that the mask and wafer are properly aligned and ready for printing.

An output appears on $I_{RST}$ of the encoder 63 to signify the completion of an alignment operation and conditioning the device for use at a later time with a new mask.

The above description of operation of the apparatus covers the situation where the wafer was placed in contact with the mask and a check of the alignment by the automatic alignment technique disclosed that the alignment was within acceptable tolerances and no further movement of the wafer relative to the mask was necessary to optimize alignment. There will now be described several alternate stages of operation which are brought into play when less than optimum conditions are encountered.

For example, with the state counter 62 in state 0–7, it may at times happen that, on any scan series, the pulses A'–C' and A''–C'' may commence but, for one reason or another, may not terminate at the proper times. At the start of pulse A', a trigger pulse is delivered to the one shot multivibrator circuit 121 which will operate a fixed time period after energization to deliver an output to the gate 122. If, by the time this multivibrator output appears, the pulse C' has not terminated, a $Q_{MOV}$ true output appears from the missing pulse generator 69, and the state counter 62 changes from state 0–7 to state 0–6 and places outputs on $I_{CLK}$, $I_{UP}$, and $I_{CLR}$. The circuit operates to clear the up-down counters 66 – 68, missing pulse generator 69, the pulse generators 49, 53 and the third pulse flip-flop 53', and, in addition, networks 78 and 81 operate as described above to deliver clock pulses to the three up-down counters 66 – 68 to start these counters counting up. When the counters counted up to K pulses, an output appears on the $Q_k$ output to the decoder 61 and the state counter 62 changes to state 0–14, resulting in a true output on instruction lead $I_{GMO} - I_{TOL}$ to the motor controller circuit 123 (FIG. 6b) Pulses from the motor clock 124 are delivered via the stepping motor control circuit 125 to the clockwise, up and right direction drive motors 25 – 27. The motor clock pulses are also directed to the counters 66 – 68 via the counter input control circuit 81 to count down from the stored K count. Since the K count in the counters in this example is an up count, a true appears on the sign qualifier outputs of each counter to the controller 123 which operates to signify to motor direction indicator circuits 126 that the three driving motors 25 – 27 are to move in a forward direction. The same sign qualifiers operate the counter input control circuit 81 to direct the motor clock pulses to the down count input of counters 66 – 68. After K pulses have been delivered to each of the drive motors 25 – 27 from the motor clock 124 and the counters 66 –68 have counted down to zero, the zero detector outputs operate to produce a $Q_{END}$ true input to decoder 61 from gate 117. The state counter 62 changes to the 0–1 state to initiate the alignment pattern scan for position determination with the patterns now in a new position with the conditions that caused the missing pulse signal eliminated.

Also, with the state counter in state 0–7, where all three counters 66 – 68 are counting down from the stored 2K count, the machine may encounter a situation where one of the lines 14 or 15 lies over one of the associated lines 19, 21 or 22, 23, respectively, and two of the three counters 66 – 68 will therefore count down to zero. When any two of the zero detector output lines goes to zero, the "equal space" circuit 127 operates to send a true output $Q_{EQL}$ to the decoder 61. The state counter changes from state 0–5 to state 0–6 and activates the $I_{CLR}$, $I_{CLK}$ and the $I_{UP}$ outputs of the encoder 63. The drive motors 25 – 27 are operated as described above to reposition the wafer relative to the mask for a new measurement.

In the above description it was assumed that, at the tolerance check, the counts registered in all three up-down counters 66 – 68 were within tolerance and the device then operated to bring the wafer into contact with the mask. In those instances where one or more of the counters indicate that the alignment is not within tolerance, i.e., by a one appearing on any of the fourth and higher binaries, the output of the associated zero detector will indicate a non-zero state and the $Q_{END}$ true output from gate 117 will not occur. A $Q_{END}$ false when $Q_{PUL}$ occurs at the end of the tolerance count addition results in a state counter change from state 1–10 to 1–14, activating the instruction leads $I_{CNT}$ and $I_{DOWN}$.

Network 78 operates to transmit clock pulses to the tolerance counter 116 and to the down count input of the three up-down counters 66 – 68, these counters counting down to subtract the tolerance count which has been added to the counters. The $Q_{PUL}$ output of the tolerance counter indicates the end of the tolerance pulses, and changes the state counter from state 1–14 to state 0–9, placing outputs on instruction leads $I_{SF2}$, and $I_{GMO} - I_{TOL}$. The flag circuit 65 is set, i.e., its output made high. The motor controller 123 operates to deliver motor clock pulses to the three motors of the clockwise, up, and right direction drives for the wafer via control 125. The sign qualifier outputs from the three up-down counters 66 – 68 serve to operate the motor direction indicator 126 to signify to the three drive motors the particular directions they are to move, i.e., forward or reverse, in response to the up or down counts in the counters 66 – 68. These same sign qualifiers operate the counter input control 81 to select the proper ones of the up and down inputs to the three up-down counters 66 – 68 to drive these counters by the clock pulses in the direction to return them to zero.

On return of the three up-down counters 66 – 68 to zero, the output on the associated zero detectors results in a $Q_{END}$ output from the zero test gate 117 and the state counter changes to state 0–12, terminating the motor clock pulses to the up-down counters and the wafer driving motors.

Assuming there is no output on the No. of Trys counter 64, which would be the case if only one count had been stored therein responsive to only one formula determination and movement of the wafer, the state counter 62 will change to state 0–1, activating the instruction outputs $I_{CLR}$ and $I_{CPF}$, which, as described above, initiates the position determination stage of this automatic alignment device.

The position determination, formula calculations, tolerance test, etc. operations will be performed as described above to move the wafer into alignment with the mask. Each time the process is performed, a count is registered in the No. of Trys counter 64 until such time as four attempts to align the mask have been made, after which a true will appear on its $Q_{FOR}$ output. The $Q_{FOR}$ output will change the state counter from 0–12 to 0–04 at which time a $I_{RED}$ output will light a red light to indicate to the operator that the machine has made four attempts to align the mask and it has been unsuccessful, at which time the operator may attempt to align it manually or may terminate the alignment effort.

In those cases where the wafer has been moved into contact with the mask by drive 28 as described above and a test of the alignment has indicated that this relative movement has resulted in a shift outside of the allowable tolerance, an absence of the $Q_{END}$ output from the "all zero" test gate 117 will result in a change in the state counter from state 1–7 to 1–5 in response to the $Q_{PUL}$ output. The instruction leads $I_{OPN}$ and $I_{TIM}$ are activated, the $I_{OPN}$ signal serving to operate the contact drive motor 28 to separate the wafer and mask. The $I_{TIM}$ output operates the timer circuit 118 to provide a 0.2 second time delay to allow for the separation of mask and wafer after which a $Q_{TIM}$ output changes the state counter to 1–4, resulting in an output on instruction leads $I_{CNT}$ and $I_{DOWN}$. The circuit then operates as described above to subtract the tolerance count from the three up-down counters 66 – 68, na output on $Q_{PUL}$ at the end of the tolerance pulse subtraction serving to change the state counter to state 1–12.

If the output $Q_{FLG}$ of the flag circuit is clear or false, which would indicate that the mask and wafer had been bought into contact only once, the state counter 62 will change to state 1–13, placing an output on instruction leads $I_{SF2}$ and $I_{GMO} - I_{TOL}$. This circuit will then operate as described above in response to the formula count registered in each of the three up-down counters 66 – 68 to transmit motor clock pulses to the three wafer drive motors to move the wafer in the desired directions relative to the mask and into alignment. When the three up-down counters 66 – 68 have counted down to zero in response to the motor clock pulses, the $Q_{END}$ output of the "all zero" test gate 117 changes the state counter to state 1–9 which, as described above, results in the wafer and mask again being brought into contact and a recheck of the alignment of the mask and wafer being made automatically.

The $I_{SF2}$ instruction serves to set the flag circuit so that if the subsequent relative movement of the wafer and mask and a recontact of the two and a recheck of the alignment show a misalignment, the presence of a true output $Q_{FLG}$ on the flag circuit when the $Q_{PUL}$ output occurs from the tolerance counter 116 will change the state counter to state 0–4 and the $I_{RED}$ instruction will be given, lighting the red light to indicate to the operator that the mask and wafer have been aligned and brought into contact twice and final alignment has been unsuccessful.

Certain of the circuits described above with reference to FIGS. 6 *a–d* are disclosed in more detail in FIGS. 8–12; i.e. the formula magnitude determining network 78 and counter input control 81 are shown in FIGS. 8 and 9, FIG. 9 including the formula sign determining network 114. The logic circuitry for the scan counter 82, decoder 83, commutator 84, decoder 85, position flip-flops 71–74, commutator 111 and decoder 112 is shown in FIG. 10. One of the up-down counters 66 is shown in FIG. 11 including the tolerance override circuit. The motor controller 123, motor direction indicators 126 and stepping motor control 125 are shown in FIG. 12.

Referring to FIGS. 8 and 9, the initial 2K count is stored in the three counters 66 – 68 when $I_{CLK}$ and $I_{UP}$ instruction leads are true, $I_{CLK}$ activating gate 131 to transmit pulses from the clock 79 through the three gates 132, 133 and 134 and through the three gates 135, 136 and 137 to the three up-count gates 138, 139 and 141 (FIG. 9) leading to the up-count inputs of the clockwise, up, and right direction up-down counters 66, 67 and 68, respectively.

The three gates 138, 139 and 141 are activated due to the $I_{UP}$ true which appears on one input of each of the three gates 142, 143 and 144. Since a false exists on the other inputs of these three gates 142 – 144, the outputs go true to each of the gates 145, 146 and 147 which place a true on the input to gates 148, 149 and 151 which in turn place a high on their outputs to activate the gates 138, 139 and 141 to pass the clock pulses to the up inputs. When the 2K count is reached, $Q_{2K}$ to the state counter results in a false on $I_{CLK}$ of gate 131 to terminate the pulses.

With the state counter in state 0–7 after $Q_{2K}$, the $I_{DOWN}$ true activates gates 152, 153 and 154, resulting in the activation of down gates 155, 156 and 157 so that the clock pulses C1 and C2 during pulse periods A, B, and C will be transmitted to the down input of counters 66 – 68.

At this time, the true on $I_{TEST}$ activates the "A pulse, right direction" gate 161, the "B pulse - up direction" gate 162, and the "C pulse-clockwise direction" gate 163. On the first scan by slot 32, pulse A′ activates gate 164 (lead A′) to transmit the clock pulses C1 from the clock 79 through gate 165 to the three gates 166, 167 and 168 leading to the clockwise, up, and right counter gates 135, 136 and 137, respectively. Only gate 166 is activated since its other input is high from gate 161 via inverter 161′. Thus the clock pulses C1 are transmitted via gate 166, gate 135 and the downgate 155 to the down input of the clockwise up-down counter 66 which proceeds to count down from 2K.

When the pulse A″ from the pulse generator 53 appears shortly after the start of the pulse A′, the second gate 169 is activated via lead A″ to pass a second series of clock pulses C2 from clock 79′ (formed by a multivibrator 79′ from the clock pulses from clock 79, the pulses C2 being spaced between successive pulses C1 from the main clock 79).

The C2 pulses are transmitted via the gates 169, 165 and 166 to gate 135 and thus the rate of the clock pulses from clock 79 to the clockwise direction up-down counter 66 is doubled. At the end of pulse A′, the C1 pulses through the gate 164 are terminated whereas the C2 pulses through the other gate 169 continue, but in this case the clock pulse rate to the clockwise up-down counter 66 is halved to its normal rate. Therefore, during the existence of either pulse A′ or A″ and the absence of the other, the clock rate is just half the clock rate existing when the pulses A′ and A″ coincide. This results in a pulse averaging effect and corrects for variable width pulses. The total time period for the passage of clock pulses C1 and C2 through gate 142 is referred to as pulse A or pulse period A.

During the existence of the second output pulse B′ from the pulse generator 49, gate 171 is activated (via B′) to close the C1 pulses via gate 172 and gate 173 to the up-direction gate 136 and gate 156 to the down input of the up-direction up-down counter 67. Pulse output B'' activates gate 174 to transmit C2 clock pulses via gates 172, 173, 136, and 156 to the up-direction counter 67. The pulse averaging effect described above is produced by these pulses B' and B'', the combined time of these pulses being pulse B. The right direction up-down counter 68 operates in a similar manner to register the clock pulses C1 and C2 during the time period that output pulses C' and C'' exist on the output from the pulse generators 49 and 53, referred to as pulse C.

In this manner, as the slot 32 scans the bars 14, 19 and 21, the three up-down counters 66 – 68 count down from the 2K count that had been registered in each of the counters before the initiation of the scan by slot 27.

In our example above, it was assumed that bar 14 was located above the bars 19 and 21, and during the existence of pulse C, 2K clock pulses are delivered to the right direction up-down counter 68. Thus, at the end of pulse C, the right direction up-down counter 68 will have counted down to zero and its zero detector output goes true to decoder 88.

The pattern position determining circuit is shown in detail in FIG. 10, the scan counter 82 comprising a pair of flip-flops 181 and 182 which operate in response to the four pulses from photo detectors 39 and 40 on each scan series to activate gates 183 – 186 in sequence. On the first pulse, gate 183 conditions the first pair of position flip-flops 187 and 188 to receive the two bit position information from decoder 88. As stated above, the right direction counter 68 had counted down to zero, placing a low on the zero detector output, and thus producing a high on the input of gate 189 via inverter 191. The output of gate 189 goes low to the most-significant-bit gate 192 and least-significant-bit gate 193, the outputs of which both go high to the position flip-flops 188 and 187, respectively. The $I_{SPF}$ input at the end of the scan by slot 32 activates gate 194 to store these two bits (i.e., 1,1) in flip-flops 187 and 188.

Pairs of bits are subsequently stored in flip-flop pairs 72, 73 and 74 for the following scans 2, 3 and 4, respectively, and thus the pattern position information is stored in the form of bit pairs. The first pulse from sensor 39 at the start of the next scan series clears the two flip-flops 181 and 182 to place a true on the four gates 195, 196 associated with the first and third position flip-flop circuits 71 and 73 and the four bits from these two flip-flop circuits are transmitted through the four gates 197, 198, 199 and 201 to the decoder circuit 112, where the single output 101' is made true to signify that the two bars 14 and 15 share the one section 101 in common. The other eight output leads of the decoder 102' – 109' remain false.

As the following scan by slot 34 occurs, the first pulse from photosensor 40 results in true on the four gates 202, 203 to transmit the two bit information from flip-flop circuits 72 and 74 through to the decoder 112.

In similar manner, the two subsequent pulses from photosensor 40 function as described above to transmit the two bit information registered in the position flip-flop circuits 71, 72 and 73, 74 to produce an output on one particular output terminal of the decoder 112 for each scan.

Referring to FIG. 8, assume that line 109' of decoder 112 is activated for the first and third scans. A true on line $\overline{9}$ (from output 109'; the input lines $\overline{1}$, $\overline{2}$, $\overline{3}$, etc. receive their true and false inputs from the decoder output lines 101, 102, 103, etc., respectively.) and a true on the scan 1 input ($\overline{S1}$) from flip-flop 181 activates gates 206, 207, 208 and 209 to in turn activate gates 211, 163 and 212 and the associated inverters to place a high on one input of each gate 213, 214 and 215, thus opening these three gates to permit the clock pulses C1, C2 to flow to the three up-down counters 66 – 68 from the clocks 79 and 79' during the existence of pulse C (i.e., C'+C'') on the inputs to gates 216, 217.

On the third scan, with line $\overline{9}$ again true and scan $\overline{S3}$ true, clock gates 218, 219, 221 and 222 are activated to in turn activate gates 163, 214, 162, 173 and 223. Clock pulses C1 and C2 are passed to the clockwise direction counter 66 during pulse B via gates 223 and 135, to the up-direction counter 67 during pulse B via gates 173 and 136, and to the right direction counter 68 during pulse C via gates 214 and 137.

Assume for this description that line $\overline{4}$ (from output 104') is activated for the second and fourth scans. On the second scan S2, gates 207 and 224 would be activated, with the result that the clock pulses C1 and C2 would be transmitted to the right direction counter 68 during pulse A via gates 162, 168 and 137 and to both the clockwise and up-direction counters 66 and 67 during pulse C via gates 211 213 and 135 and 212, 215 and 136, respectively. On the fourth scan S4 gates 225 and 226 would be activated to cause the clock pulses to flow to the clockwise, up and right direction counters during pulse A.

The sign for each formula which determines whether the clockwise, up, and right direction counters 66, 67 and 68 count up or down is determined by the gates 231, 232 and 233, respectively (FIG. 9). For example, during the scan by slot 32, with the outputs 109' and S1 true, gates 234, 235 are activated since the other inputs to gates 234 and 235 are true from gate 208; the outputs of gates 234 and 235 go true to gates 231 and 232 and these gates go high. Gate 236 goes true and thus gate 233 goes high. Thus, one input of each of the gates 145, 146 and 147 goes high and their outputs go low to gates 148, 149 and 151 thus enabling the gates 138, 139 and 141 to direct the clock pulses to the "up" inputs of the clockwise, up and right direction counters, 66, 67 and 68, respectively. Thus, on the scan by slot 32 (scan 1) with lead 109' true, all the counters count up, i.e., the + sign as shown in the sector row 109 of the above table for $+C_1$ in all three direction formulas.

On the third scan (S3) with 109' true, the output of gate 237 goes high due to a low-high on its two inputs and, since a high is present on the output of gate 236, gate 233 goes high and the output of inverter 233' goes low to gate 147. Therefore, the clock pulses are directed to the "down" count input of the right direction counter 68. This concurs with the $-C_3$ term in the sector 109 row of the right direction formula column in the above table. The outputs of gates 231 and 232 are high, resulting in the clock pulses being directed to the "up" count input of the clockwise and up direction counters 66 and 67.

A typical form of binary coded decimal counter employed for the clockwise direction up-down counter 66, as well as counters 67 and 68, is shown in FIG. 12. The tolerance override circuit comprises the three gates 238, 239 and 240 which are all activated by $I_{T2K}$ = true to override the binary information on the first three binary outputs to the zero detector and indicate to the zero detector that these binaries are all zero, even though up to an eight count may actually be present. These three gates 238, 239 and 240 are also controlled from the tolerance switch 115 so that with a ± 10 μin. tolerance, gate 238 is activated to override the first binary, gates 238 and 239 are activated with the switch placed on 20 μin. to override the first and second binaries, and all three gates activated on the 40 μin. tolerance. The circuitry in the upper left provides the sign information to direct the motor drives in the forward or reverse direction depending on the up or down count stored in the associated counter.

The gate circuits for the motor controller system are shown in FIG. 12 including gates 242, 243 and 244 for delivering clock pulses to the stepping motors, gates 245, 246 and 247 for designating the direction of motor movement, and gates 248 for directing the pulse trains to the counters 66, 67 and 68 to count them back to zero.

The patterns may take other forms as illustrated by FIGS. 13 and 14. The single cross 251, 252 on one object may be opaque and the single cross 253, 254 may be reflective. The opaque and reflective bars, for example bars 251 and 253, when scanned, will give pulses of opposite sign as indicated by pulses 251' and 253' of FIG. 14. Thus, the spacing between pulses and the direction of the first pulse relative to the direction of the second pulse may be utilized by the logic circuitry to compute the extent of misalignment and provide corrective drive signals.

What is claimed is:

1. A system for aligning two objects, one of said objects having first and second aligning patterns thereon, each pattern comprising a first elongated bar and a second elongated bar at an angle to said first bar, the other object having first and second aligning patterns thereon, each pattern comprising a first elongated bar and a second elongated bar at an angle to said first bar substantially equal to the angle between the first and second bars on said first object, the first and second bars in said first pattern on said first object adapted to be positioned parallel to and at a preselected position linearly spaced from said first and second bars, respectively, in said first pattern on said second object and the first and second bars in said second pattern on said first object adapted to be positioned parallel to and at a preselected position linearly spaced from said first and second bars, respectively, in said second pattern on said second object when said two objects are in alignment, said system comprising means for scanning said first bars in each of said patterns and for scanning said second bars in each of said patterns, measurement means coupled to said scanning means for producing output signals indicative of the position of the first object pattern bars relative to the second object pattern bars and proportional to the distance that said bars are removed from the preselected position relative to their associated bars, and drive means responsive to said output signals for producing relative movement between said two objects to bring said first object bars in each pattern to the preselected position relative to the bars of said associated bars in each pattern on said second object.

2. A system for aligning two objects as claimed in claim 1 wherein each pattern on said other object comprises a first pair of elongated bars and a second pair of elongated bars at said angle to said first pair of bars, and wherein said first and second bars in said first pattern and said first and second bars in said second pattern on said first object are positioned parallel to and at a preselected position spaced from said first and second pairs of bars in said first and second patterns on said other object, respectively, when said two objects are in alignment.

3. A system as claimed in claim 2 wherein said preselected position for the first and second bars in said first pattern on said first object is centrally spaced within said first and second pairs of bars, respectively, in said first pattern on said second object and wherein said preselected position for the first and second bars in said second pattern on said first object is centrally spaced within said first and second pairs of bars, respectively, in said second pattern on said second object.

4. A system as claimed in claim 2 wherein said scanning means comprises means for creating a projection image of said aligning patterns at an image plane, an opaque moving member at said image plane having a first and second pair of openings therein, one of said openings in said first pair being oriented in the same direction as said first bar in said first aligning pattern on said one object and said first pair of bars in said first aligning pattern on said other object, the second of said openings in said first pair being oriented in the same direction as said second bar in said first aligning pattern on said one object and said second pair of bars in said first aligning pattern on said other object, one of said openings in said second pair being oriented in the same direction as said first bar in said second aligning pattern on said one object and said first pair of bars in said second aligning pattern on said other object, the second of said openings in said second pair being oriented in the same direction as said second bar in said second aligning patterns on said other object, means for moving said opaque member to scan said first bar and said first pair of bars in said first aligning patterns on said two objects with said one opening in said first pair of openings, to scan said second bar and said second pair of bars in said first aligning patterns on said two objects with said second opening in said first pair of openings, to scan said first bar and said first pair of bars in said second aligning pattern on said two objects with said one opening in said second pair of openings, and to scan said second bar and said second pair of bars in said second aligning patterns on said two objects with said second opening in said second pair of openings, and means for creating an electrical pulse as each opening passes over one of the associated pattern bars aligned in the same direction as said opening, and said measurement means comprises means for determining the time between said electrical pulses.

5. A system as claimed in claim 4 wherein said scanning means produces four sets of electrical pulses, one set for each bar on said first object and associated pair of bars on said second object, each set comprising three pulses, one for each bar of said first object bar and said pair of bars, and wherein said measurement means comprises means for determining the time between said pulses in a set.

6. A system as claimed in claim 5 wherein said measurement means comprises a clock pulse generator, three pulse counters, and means for directing clock pulses to separate ones of said pulse counters during the time between the three separate pairs of said electrical pulses in each of said three pulse sets.

7. A system as claimed in claim 6 wherein the direction that said first object bar is off-center relative to its associated pair of bars in an aligning pattern is indicated by that particular one of said three counters which records that number of clock pulses representing the time between the two electrical pulses produced by the two bars in said pair of bars.

8. A system as claimed in claim 4 wherein said moving member having said openings therein comprises a belt having elongated slots therein.

9. A system as claimed in claim 4 wherein said measurement means comprises first circuit means operative responsive to the time between said electrical pulses for producing an output indicative of the direction of said first object pattern bars relative to said second object pattern bars and second circuit means operative responsive to the time between said electrical pulses for producing an output indicative of the distance said first object pattern bars are removed from the preselected position relative to said second object bars.

10. A system as claimed in claim 2 wherein said measurement means comprises first circuit means for producing output signals in response to said scanning indicative of the position of each first and second bars in each first and second aligning patterns on said one object relative to each associated first and second pair of bars in each first and second aligning pattern on said other object, respectively, second circuit means operative responsive to said position output signals to produce output signals proportional to the distance that each first and second bars in each first and second aligning patterns on said one object is removed from said preselected position relative to said associated pair of bars on said second object, and third circuit means operative responsive to said position output signals to produce output signals proportional to the direction that each said first and second bars on said one object are removed from said preselected positions relative to said associated pairs of bars on said other object.

11. A system as claimed in claim 10 wherein said second circuit means comprise means for producing said output signals in the form of pulse trains, the number of pulses in each train being proportional to said distance measured.

12. A system as claimed in claim 11 wherein said measurement means includes an up-down counter, the pulses in said train being recorded in said counter as a measure of said distance, the count being registered as an up count or down count dependent on the direction signal output of said third circuit means.

13. A system as claimed in claim 1 wherein said scanning means comprises means for creating a projection image of said aligning patterns at an image plane, an opaque moving member at said image plane having a first and second pair of openings therein, one of said openings in said first pair being oriented in the same direction as said first bars in said first aligning patterns on said two objects, the second of said openings in said first pair being oriented in the same direction as said second bars in said first aligning patterns on said two objects, one of said openings in said second pair being oriented in the same direction as said first bars in said second aligning patterns on said two objects, the second of said openings in said second pair being oriented in the same direction as said second bars in said second aligning patterns on said two objects, means for moving said opaque member to scan said first bars in said first aligning patterns on said two objects with said one opening in said first pair of openings, to scan said second bars in said first aligning patterns on said two objects with said second opening in said first pair of openings, to scan said first bars in said second aligning patterns in said two objects with said one opening in said second pair of openings, and to scan said second bars in said second aligning patterns on said two objects with said second opening in said second pair of openings, and means for creating an electrical pulse as each opening passes over one of the associated pattern bars aligned in the same direction as said opening, and said measurement means comprises means for determining the time between said electrical pulses.

14. A system as claimed in claim 13 wherein said moving member having said openings therein comprises a belt having elongated slots therein.

15. A system as claimed in claim 13 wherein said measurement means comprises first circuit means operative responsive to the time between said electrical pulses for producing an output indicative of the direction of said first object pattern bars relative to said second object pattern bars and second circuit means operative responsive to the time between said electrical pulses for producing an output indicative of the distance said first object pattern bars are removed from the preselected position relative to said second object bars.

16. A system as claimed in claim 13 wherein said measurement means comprises first circuit means for producing output signals in response to said scanning indicative of the position of each first and second bars in each first and second aligning patterns on said one object relative to each associated first and second bars in each first and second aligning pattern on said other object, respectively, second circuit means operative responsive to said position output signals to produce output signals proportional to the distance that each first and second bars in each first and second aligning patterns on said one object is removed from said preselected position relative to said associated bars on said second object, and third circuit means operative responsive to said position output signals to produce output signals proportional to the direction that each said first and second bars on said one object are removed from said preselected positions relative to said associated bars on said other object.

* * * * *